United States Patent
Song

(10) Patent No.: US 10,553,295 B2
(45) Date of Patent: Feb. 4, 2020

(54) MEMORY SYSTEM WHICH STORES META-DATA AND META-LOG, AND OPERATING METHOD THEREOF

(71) Applicant: SK hynix Inc., Gyeonggi-do (KR)

(72) Inventor: Hae-Lyong Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/682,657

(22) Filed: Aug. 22, 2017

(65) Prior Publication Data

US 2018/0144806 A1 May 24, 2018

(30) Foreign Application Priority Data

Nov. 24, 2016 (KR) .................. 10-2016-0157117

(51) Int. Cl.
*G11C 16/34* (2006.01)
*G11C 16/08* (2006.01)
*G11C 16/16* (2006.01)

(52) U.S. Cl.
CPC .......... *G11C 16/3431* (2013.01); *G11C 16/08* (2013.01); *G11C 16/16* (2013.01)

(58) Field of Classification Search
CPC ...... G11C 16/3431; G11C 16/08; G11C 16/16
USPC .................................................... 365/185.11
See application file for complete search history.

(56) References Cited

U.S. PATENT DOCUMENTS

| | | | | |
|---|---|---|---|---|
| 2008/0276224 A1* | 11/2008 | Gyure | ................ | G06F 11/3688 717/126 |
| 2008/0301506 A1* | 12/2008 | Chang | .................. | H04L 43/065 714/57 |
| 2013/0024722 A1* | 1/2013 | Kotagiri | ............. | G06F 11/1004 714/6.1 |
| 2013/0042054 A1* | 2/2013 | Jung | ................... | G06F 12/0246 711/103 |
| 2013/0046918 A1 | 2/2013 | Im | | |
| 2014/0334232 A1* | 11/2014 | Nam | ..................... | G11C 16/16 365/185.17 |
| 2015/0301755 A1 | 10/2015 | Chodem et al. | | |
| 2016/0266795 A1* | 9/2016 | Woo | ........................ | G06F 3/061 |
| 2016/0364171 A1* | 12/2016 | Frank | .................... | G06F 3/0613 |
| 2017/0262369 A1* | 9/2017 | Murphy | ............... | G06F 12/084 |
| 2017/0263306 A1* | 9/2017 | Murphy | ............ | G11C 11/4091 |
| 2017/0308464 A1* | 10/2017 | Hwang | .................. | G06F 11/14 |
| 2018/0004428 A1* | 1/2018 | Seong | ................... | G06F 12/128 |

* cited by examiner

*Primary Examiner* — Sung Il Cho
(74) *Attorney, Agent, or Firm* — IP & T Group LLP

(57) ABSTRACT

A memory system may include: a nonvolatile memory device suitable for storing write-requested data; and a controller including a first volatile memory region suitable for storing meta-data for the write-requested data and a second volatile memory region suitable for storing a meta-log for the meta-data, the controller may store the meta-data or the meta-log according to a logical address range of the meta-data.

16 Claims, 11 Drawing Sheets

FIG. 7
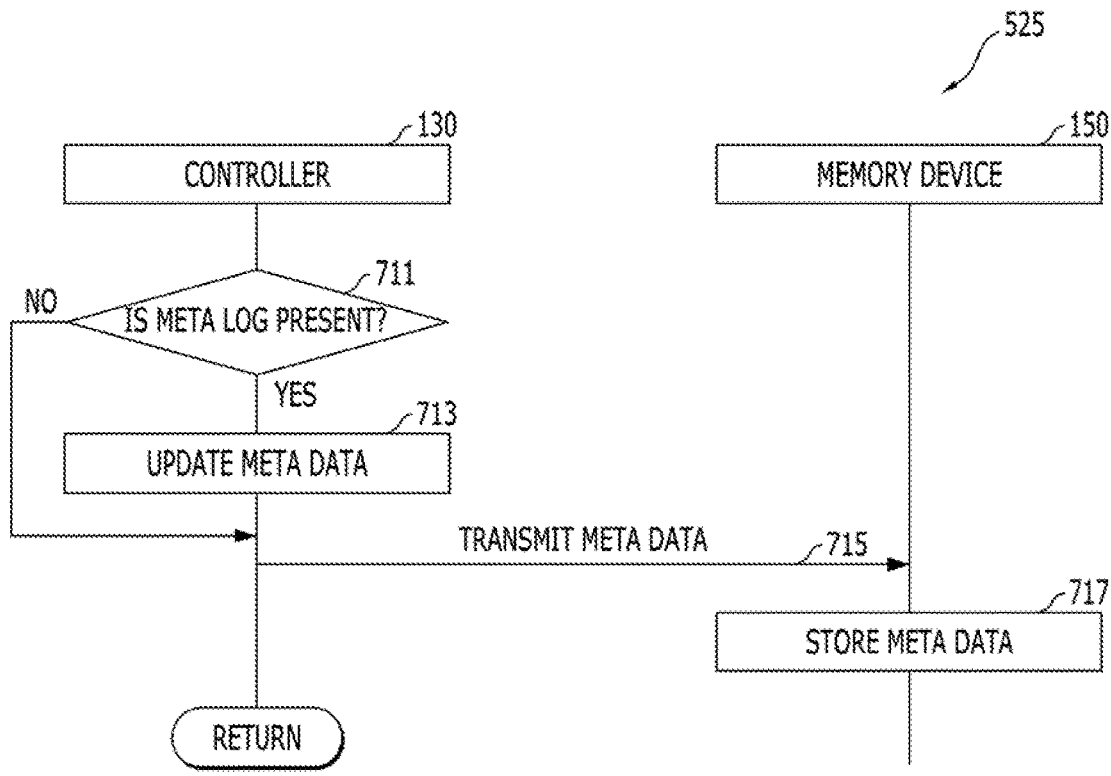
FIG. 8A
| BLOCK 0 | BLOCK 1 | BLOCK 2 | ... | BLOCK N |
|---|---|---|---|---|
| - | - | - | | |
| - | - | - | | |
| - | - | - | | |
| - | - | - | | |
| - | - | - | | |
| - | - | - | | |
| . | . | . | | |
| . | . | . | | |
| . | . | . | | |
FIG. 8B
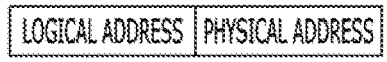

FIG. 9

| BLOCK 0 | BLOCK 1 | BLOCK 2 | ... | BLOCK N |
|---|---|---|---|---|
| - | LOGICAL VALUE 3 | - | | |
| - | - | - | | |
| - | - | - | | |
| - | - | - | | |
| - | - | - | | |
| - | - | - | | |
| - | - | - | | |
| - | - | - | | |

FIG. 10A

| LOGICAL ADDRESS | PHYSICAL ADDRESS |
|---|---|
| LOGICAL VALUE 3 | PHYSICAL VALUE 3 |

FIG. 10B

| LOGICAL ADDRESS | PHYSICAL ADDRESS |
|---|---|
| LOGICAL VALUE 3 | PHYSICAL VALUE 3 |
| LOGICAL VALUE 10 | PHYSICAL VALUE 1 |
| LOGICAL VALUE 20 | PHYSICAL VALUE 2 |
| - | - |
| - | - |
| - | - |

FIG. 11A

| BLOCK 0 | BLOCK 1 | BLOCK 2 | ... | BLOCK N |
|---|---|---|---|---|
| - | LOGICAL VALUE 3 | - | | |
| LOGICAL VALUE 10 | - | - | | |
| - | - | - | | |
| - | - | - | | |
| - | - | - | | |
| - | - | - | | |
| - | - | - | | |
| - | - | - | | |

FIG. 11B

| LOGICAL ADDRESS | PHYSICAL ADDRESS |
|---|---|
| LOGICAL VALUE 3 | PHYSICAL VALUE 3 |
| LOGICAL VALUE 10 | PHYSICAL VALUE 1 |

FIG. 11C

| LOGICAL ADDRESS | PHYSICAL ADDRESS |
|---|---|
| LOGICAL VALUE 20 | PHYSICAL VALUE 2 |
| - | - |
| - | - |
| - | - |

FIG. 12

| BLOCK 0 | BLOCK 1 | BLOCK 2 | ... | BLOCK N |
|---|---|---|---|---|
| - | LOGICAL VALUE 3 | - | | |
| LOGICAL VALUE 10 | - | - | | |
| - | - | - | | |
| - | - | - | | |
| - | - | LOGICAL VALUE 20 | | |
| - | - | - | | |
| - | - | - | | |
| - | - | - | | |

MEMORY SYSTEM WHICH STORES META-DATA AND META-LOG, AND OPERATING METHOD THEREOF

CROSS-REFERENCE TO RELATED APPLICATION

This application claims priority under 35 U.S.C. § 119 to Korean Patent Application No. 10-2016-0157117 filed on Nov. 24, 2016 in the Korean Intellectual Property Office, the disclosure of which is incorporated herein by reference in its entirety.

TECHNICAL FIELD

Exemplary embodiments relate to a memory system including a memory device, and an operating method thereof.

DISCUSSION OF THE RELATED ART

The computer environment paradigm has changed to ubiquitous computing systems that can be used anytime and anywhere. Due to this, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption because they have no moving parts. Examples of memory systems having such advantages include universal serial bus (USB) memory devices, memory cards having various interfaces, and solid state drives (SSD).

Conventional memory systems manage both meta-data corresponding to user data of the memory device and meta-logs representing changed records of the meta data, Generally, a memory system generates meta-logs reflecting changes of the meta data, and then updates the meta-data based on the meta logs. Significant resources are required to manage the meta-logs and the meta-data.

SUMMARY

Various embodiments of the present invention are directed to an improved memory system. The memory system may optimize the management of meta-data and meta-logs thus improving the use efficiency of a memory device employed by the memory system and making it possible to more rapidly and reliably process data to the memory device. Various embodiments of the present invention are directed to an operating method of the improved memory system.

In an embodiment, a memory system may include: a nonvolatile memory device suitable for storing write-requested data; and a controller including a first volatile memory region suitable for storing meta-data for the write-requested data and a second volatile memory region suitable for storing a meta-log for the meta-data, the controller may store the meta-data or the meta-log according to a logical address range of the meta-data.

The controller may store the meta-data or the meta-log by comparing the logical address range of the meta-data with a predetermined threshold range.

When the logical address range of the meta-data falls within the predetermined threshold range, the controller may store the meta-data in the first region.

When the logical address range of the meta-data does not fall within the predetermined threshold range, the controller may store the meta-log in the second region.

The meta-data stored in the first region may be divided into a plurality of meta-data groups each having logical address range within the predetermined threshold range and a suitable size for being stored to the nonvolatile memory device through a single storage operation, and when a number of meta-logs in the second region reaches a predetermined threshold number, the controller may further: select one or more meta-logs stored in the second region such that corresponding meta-data are included in a single one among the plurality of meta-data groups; update the meta-data based on the meta-logs stored in the second region; invalidate the meta-logs used for the update of the meta-data; store the updated meta-data, the invalidated meta-logs and remaining valid meta-logs in the nonvolatile memory device; and erase the invalidated meta-logs in the second region.

The respective meta-data may include a logical address mapped to a physical address of the write-requested data stored in the nonvolatile memory device, and the respective meta-logs may include a logical address mapped to a physical address of the write-requested data stored in the nonvolatile memory device.

When turning off the memory system, the controller may further: update the meta-data based on all of the meta-logs stored in the second region; invalidate all of the meta-logs stored in the second region; store all of the meta-data and all of the meta-logs in the nonvolatile memory device; and erase the invalidated meta-logs in the second region.

The respective meta-logs may represent change history of the respective meta-data stored in the first volatile memory region.

The controller may stores the meta-data in the nonvolatile memory device by units of the plurality of meta-data groups through a plurality of storage operations.

In an embodiment, an operating method for a memory system comprising a nonvolatile memory device, and first and second volatile memory regions, the operating method may include: storing write-requested data in the nonvolatile memory device; and storing meta-data for the write-requested data in the first volatile memory region or storing meta-logs for the meta-data according to a logical address range of the meta-data.

The storing meta-data or meta-logs may be performed by comparing the logical address range of the meta-data with a predetermined threshold range.

The storing meta-data may be performed when the logical address range of the meta-data falls within the predetermined threshold range.

The storing meta-logs may be performed when the logical address range of the meta-data does not fall within the predetermined threshold range.

The meta-data stored in the first region may be divided into a plurality of meta-data groups each having logical address range within the predetermined threshold range and a suitable size for being stored to the nonvolatile memory device through a single storage operation, and when a number of meta-logs in the second region reaches a predetermined threshold number, may further include: selecting one or more meta-logs stored in the second region such that corresponding meta-data are included in a single one among the plurality of meta-data groups; updating the meta-data based on the meta-logs stored in the second region; invalidating the meta-logs used for the update of the meta-data; storing the updated meta-data, the invalidated meta-logs and remaining valid meta-logs in the nonvolatile memory device; and erasing the invalidated meta-logs in the second region.

The respective meta-data may include a logical address mapped to a physical address of the write-requested data stored in the nonvolatile memory device, and the respective meta-logs may include a logical address mapped to a physical address of the write-requested data stored in the nonvolatile memory device.

When turning off the memory system, may further include: updating the meta-data based on all of the meta-logs stored in the second region; invalidating all of the meta-logs stored in the second region; storing all of the meta-data and all of the meta-logs in the nonvolatile memory device; and erasing the invalidated meta-logs in the second region.

The respective meta-logs may represent change history of the respective meta-data stored in the first volatile memory region.

The storing of the meta-data in the nonvolatile memory device may be performed by units of the plurality of meta-data groups through a plurality of storage operations.

BRIEF DESCRIPTION OF THE DRAWINGS

These and other features and advantages of the present invention will become apparent to those skilled in the art to which the present invention pertains from the following detailed description in reference to the accompanying drawings, wherein:

FIG. 7 is a diagram illustrating a step of storing meta data into a memory device illustrated in FIG. 5.

FIGS. 8A to 12 are diagrams illustrating the operating method shown in FIG. 5.

DETAILED DESCRIPTION

Figure 1:
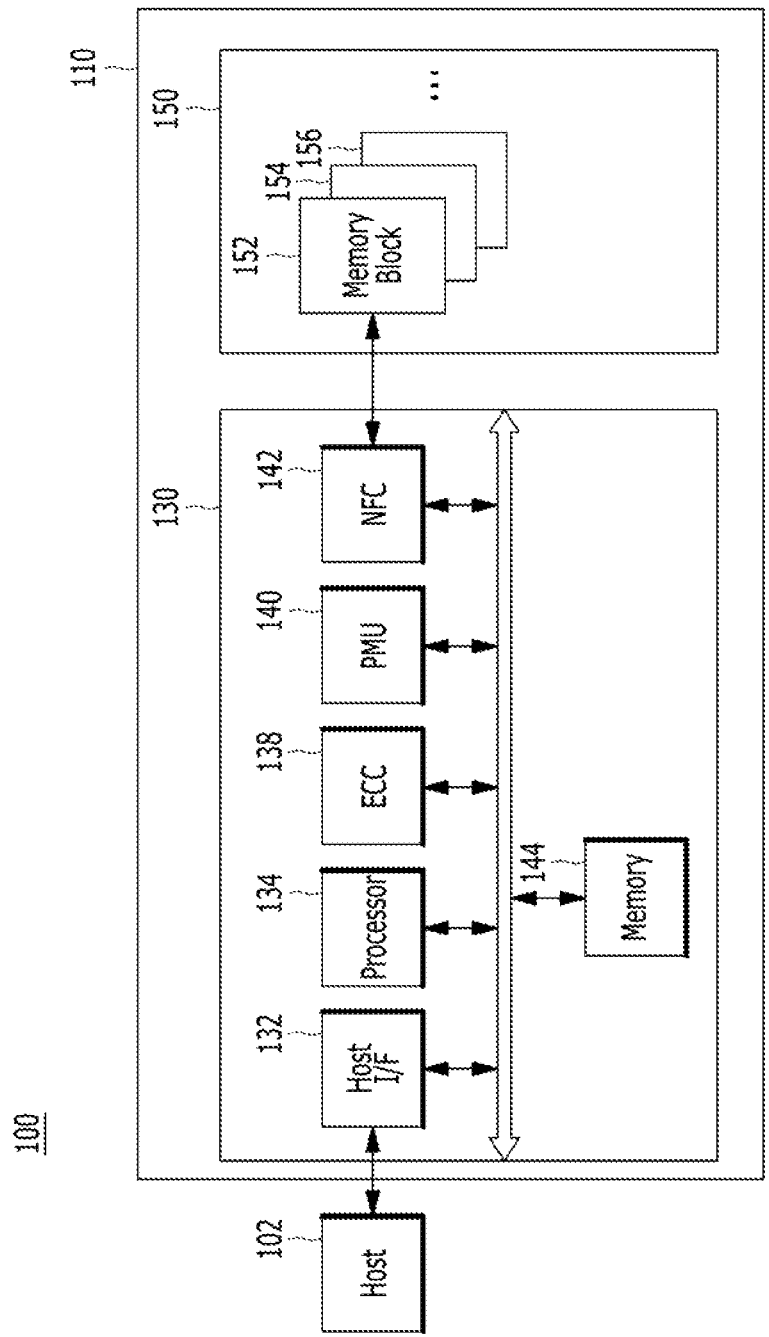
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains, Throughout the disclosure, like reference numerals refer to like parts throughout the various figures and embodiments of the present invention.

It will be understood that, although the terms "first", "second", "third", and so on may be used herein to describe various elements these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate various features of the embodiments.

It will be further understood that when an element is referred to as being "connected to", or "coupled to" another element, it may be directly on, connected to or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110 in accordance with an embodiment of the present invention.

Referring to FIG. 1, the data processing system 100 may include a host 102 and the memory system 110.

The host 102 may include portable electronic devices such as a mobile phone, MP3 player and laptop computer or non-portable electronic devices such as a desktop computer, game machine, TV and projector.

The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM) an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120 and the controller 130 may control data storage into the memory device 150.

The controller 130 and the memory device 150 may be integrated into a single semiconductor device, which may be included in the various types of memory systems as exemplified above.

Non-limited application examples of the memory system 110 may include a computer, an Ultra Mobile PC (UMPC), a workstation, a net-book a Personal Digital Assistant (PDA), a portable computer, a web tablet, a tablet computer a wireless phone, a mobile phone, a smart phone, an e-book, a Portable Multimedia Player (PMP) a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 50 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102, For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) unit 132, a processor 134, an error correction code (ECC) unit 138, a Power Management Unit (PMU) 140, a memory device controller (MDC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (BATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The MDC 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the MDC 142 may be a NAND flash controller and may generate a control signal for the memory device 150 and process data to be provided to the memory device 150 under the control of the processor 134. The MDC 142 may work as an interface (e.g. a NAND flash interface) for processing a command and data between the controller 130 and the memory device 150. Specifically, the MDC 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
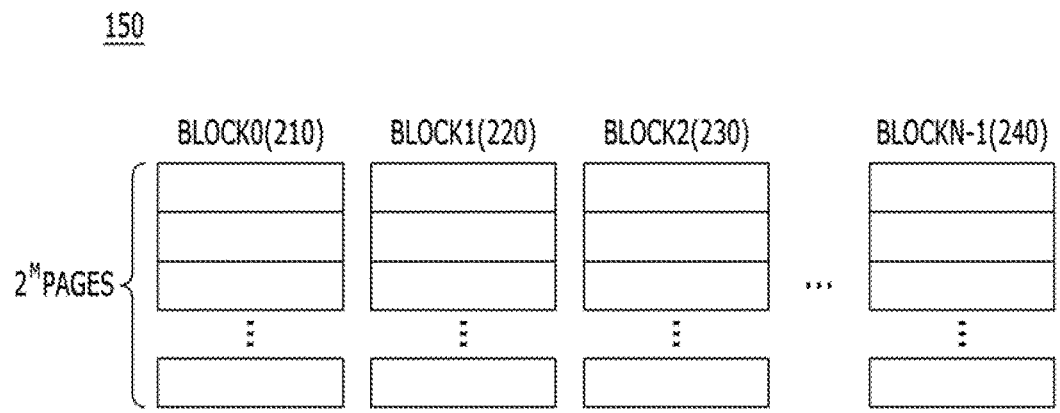
FIG. 2 is a schematic diagram illustrating an exemplary configuration of a memory device employed in the memory system of FIG. 1.

FIG. 2 is a schematic diagram illustrating the memory device 150.

Referring to FIC. 2, the memory device 150 may include a plurality of memory blocks 0 to N−1 and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, a multi-level cell (MLC) storing 2-bit data, a triple level cell (TLC) storing 3-bit data, a quadruple level cell (QLC) storing 4-bit level cell, a multiple level cell storing 5-or-more-bit data, and so forth.

Figure 3:
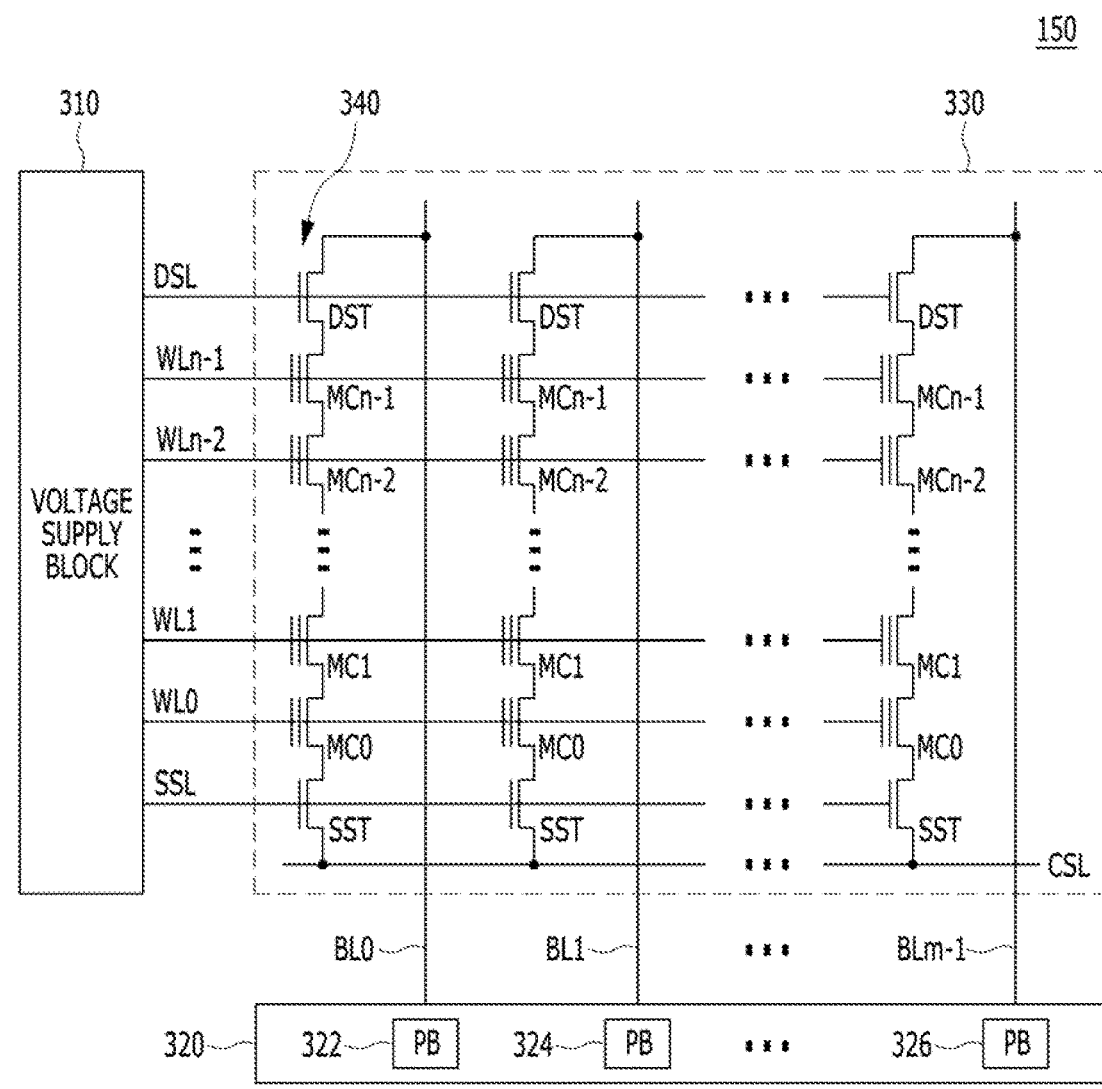
FIG. 3 is a circuit diagram illustrating n exemplary configuration of a memory cell array of a memory block in the memory device of FIG. 2.

FIG. 3 is a circuit diagram illustrating n exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm-1. The cell string 340 of each column may include one or more drain select transistors DST and one or more source select transistors SST. Between the drain and select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
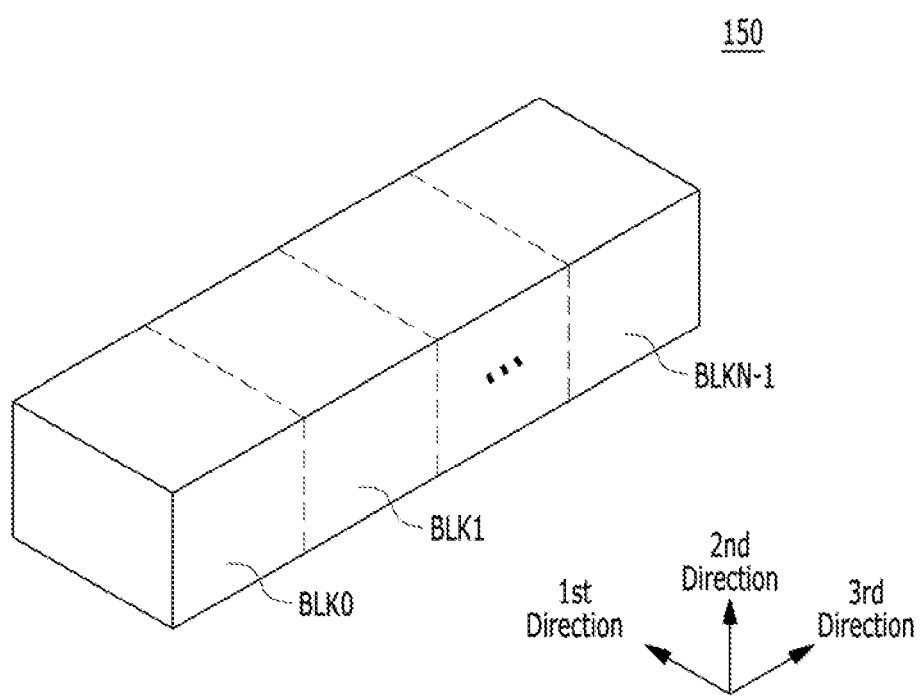
FIG. 4 is a schematic diagram illustrating an exemplary three-dimensional structure of the memory device of FIG. 2.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1 each having a 3D structure (or vertical structure).

Figure 5:
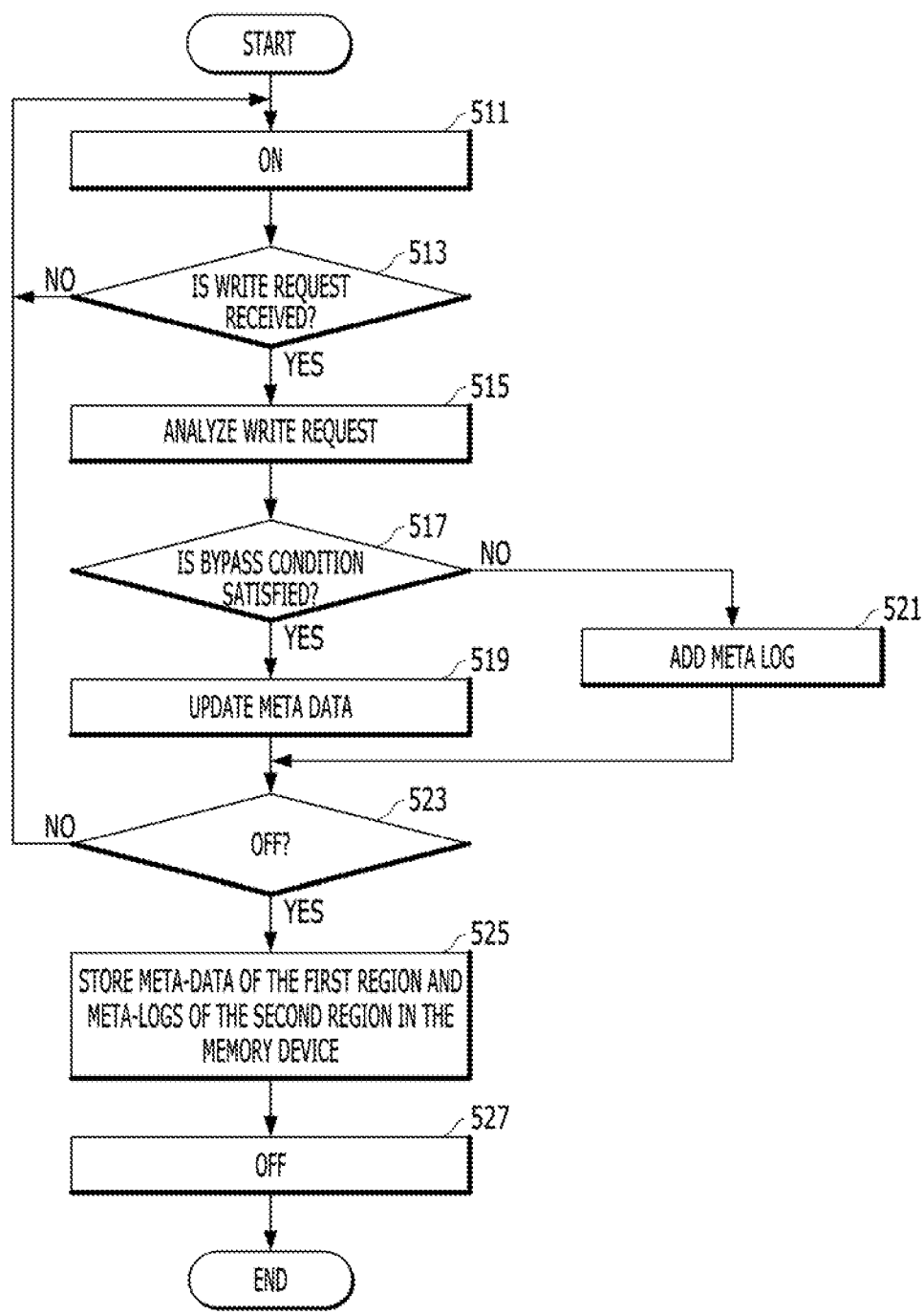
FIG. 5 is a diagram illustrating an operating method of a memory system in accordance with an embodiment of the present invention.

FIG. 5 is a diagram illustrating an operating method of the memory system 130 in accordance with an embodiment of the present invention. FIGS. 8 to 12 are diagrams illustrating the operating method shown in FIG. 5.

When user data is written into the memory device 150 of the memory system 130, meta-data corresponding to the user data are stored along with the user data in the memory device 150.

The meta-data are data describing the user data, i.e., information about attributes of the user data and/or a mapping relationship between logical address and physical address of the user data.

Referring to FIG. 5, an operating method of the memory system 110 in accordance with an embodiment of the present invention may start by turning on the memory system 110 at step 511. For example, based on a command received from the host 102, the memory system 110 may be turned on.

If the memory system 110 is turned on, the controller 130 may enable a meta-region in the memory 144. The meta-region may include a first region and a second region. The first region may store meta-data corresponding to user data written in the memory device 150. For example, as shown in FIG. 8A, the first region may store the meta-data in a mapping table. In the mapping table, logical addresses are respectively mapped to physical addresses of the memory device 150. When the memory system 110 is turned on, the controller 130 may access the memory device 150 and read meta-data corresponding to the user data stored in the memory device 150.

The meta-data are stored in the memory device 150, which is a nonvolatile memory device. The memory 144 of the controller 130 is a volatile memory and can only store the meta-data temporarily.

The meta-data includes logical addresses and physical addresses of the memory device 150 and generally has a relatively large size. The meta-data may also include additional information about the user data. Even when the memory 144 of the controller 130 is large enough to store all meta-data, it may not be possible to store all of the meta-data into the memory device 150 through a single storage operation. Hence, the meta-data may be divided into a plurality of groups each having a preset size, and the plurality of groups of the meta-data may be stored in the memory device 150 through a plurality of storage operations. For example, all of the meta-data may be divided into five groups and five data storage operations may be performed to store all of the meta-data into the memory device 150.

In the case where the size of the memory 144 is not large enough for storing all of the meta-data, the entire meta-data are stored in only the memory device 150, and only some of the meta-data may be stored in the memory 144. In this case, it is possible to store all of the meta-data stored in the memory 144 in the memory device 150 through a single storage operation. However, a plurality of storage operations may also be performed when the entire meta-data is updated because the meta-data stored in the memory 144 is only some of the entire meta-data.

The second region may be allocated for storing a meta-log representing the history of changes of the respective meta-data stored in the first region. The meta-log may also be updated when the meta-data of the first region is updated. Therefore, as shown in FIG. 8B the second region may store the meta-log, in a mapping table. In a meta-log mapping table, a logical address and a physical address of the memory device 150 are mapped to each other. The addresses stored in the second region may represent meta-data which are changed. When the memory system 110 is turned on, the second region may be empty.

For example, a write request for user data may be received in operation 513. The write request may include the size and logical address of user data. For example, the write request may include 'logical value 3' as the logical address of the user data. The controller 130 may assign 'physical value 3' as the physical address for the user data in the memory device 150 in correspondence with the logical address 'logical value 3'. Thereby, in correspondence with the user data of the write request, meta-data may be generated to represent that 'logical value 3' and 'physical value 3' mapped to each other.

The controller 130 may analyze the write request in operation 515 to identify the logical address of the meta-data generated in correspondence with the user data requested to be written.

In operation 517, the controller 130 may determine whether the write request meets a bypass condition. For example, the bypass condition may require that a range of the logical address of the meta-data corresponding to the write request is within a predetermined threshold range. Thereby, the processor 134 may compare a range of the logical address of the meta-data corresponding to the write request with the predetermined threshold range. That is, the controller 130 may determine whether the logical address range of the meta-data is within the predetermined threshold range.

For example, when respective logical address values of ten meta-data generated in correspondence with the user data requested to be written are checked, the ten meta-data may have successive values so that the logical address range thereof may be within the predetermined threshold range. In this case, the write request corresponding to the ten meta-data may be determined to meet the bypass condition.

On the other hand, when the ten meta-data may have distributed or widely scattered logical address values so that the logical address range thereof does not fall within the predetermined threshold range. In this case, the write request corresponding to the distributed or widely scattered ten meta-data may be determined not to meet the bypass condition.

As a result of operation 517, when the write request meets the bypass condition, the controller 130 may update the meta-data to the first region in operation 519 but may not generate a meta-log of the meta-data resell ting from the update operation. Therefore, the meta-log may not be added to the second region. That is, the controller 130 updates the meta-data in the first region without adding the meta-log to the second region. For example as shown in FIG. 9 the controller 130 may map the logical address (e.g. 'logical value 3') of the user data to the physical address (e.g., 'physical value 3') for the user data of the write request. When the 'physical value 3' corresponds to page 0 of block 1, the controller 130 may map the meta-data of the 'logical value 3' to the page 0 of block 1 of the 'physical value 3'. In this way the meta-data may be updated in the first region in operation 519.

As a result of operation 517 when the write request does not meet the bypass condition, the controller 130 may generate a meta log that is a newly changed meta-data and store the generated meta-log in the second region in operation 521. That is, the controller 130 does not update the meta data in the first region when the logical address range of the meta data exceeds the threshold range. Instead, the controller 130 generates a meta log that is the newly changed meta data, and stores the meta log in the second region. For example, as shown in FIGS. 10A TO 10C, the controller 130 may generate a meta-log representing mapping relationship between the logical address and the physical address of the user data, and store the meta-log in the second region.

Figure 6:
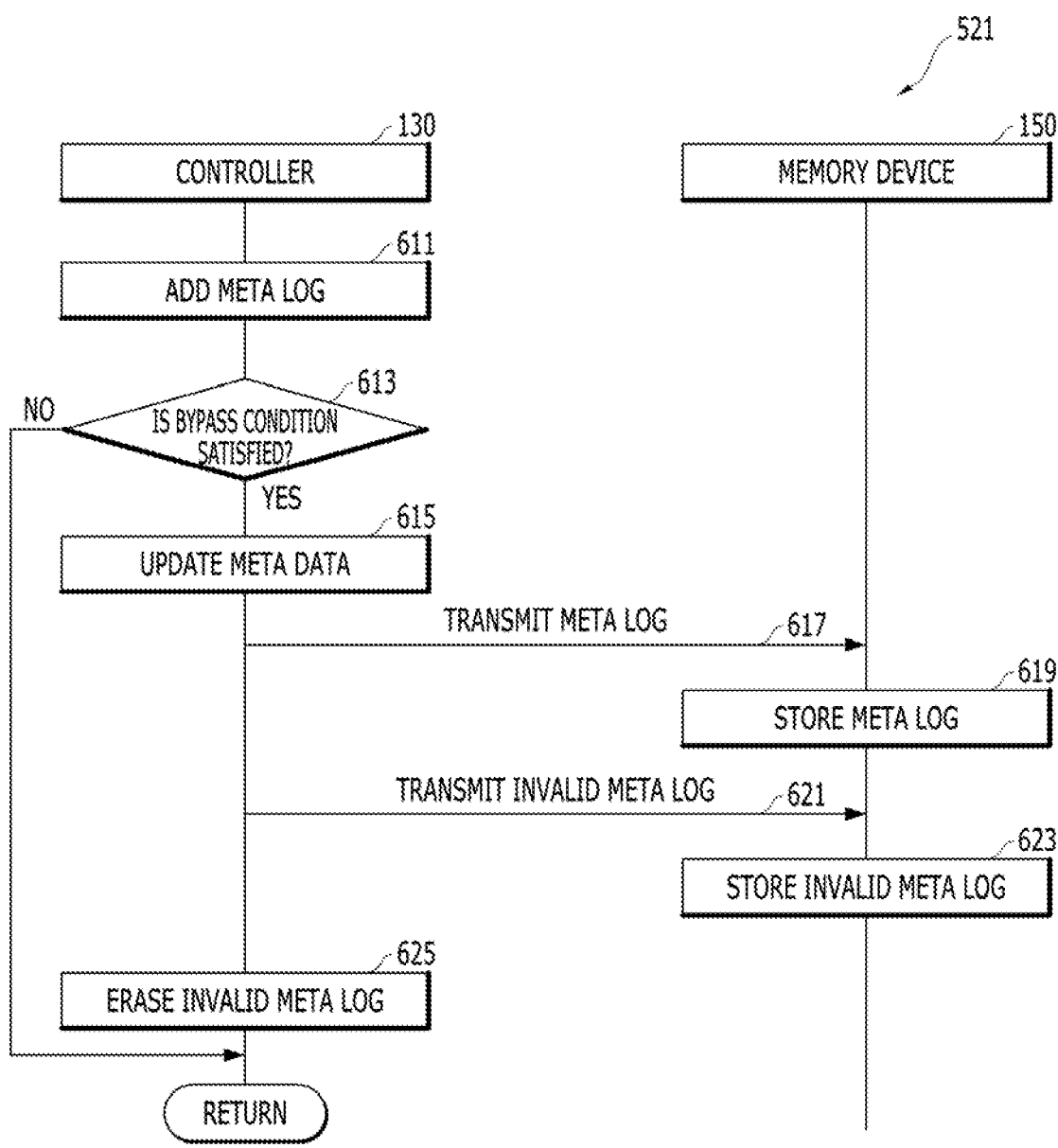
FIG. 6 is a diagram illustrating a step of adding meta log illustrated in FIG. 5.

FIG. 6 is a diagram illustrating the operation 521 of FIG. 5.

Referring to FIG. 6 the controller 130 may add the meta-log to the second region of the memory 144 in operation 611. For example, if the second region is empty, the controller 130 may add the meta-log as shown in FIG. 10A. Alternatively, if at least one other meta-log is present in the second region, the controller 130 may add a meta-log, as shown in FIG. 10B.

In operation 613, the controller 130 may determine whether the second region meets an update condition. The update condition may require that a number of meta-logs stored in the second region reach a preset threshold number. Therefore, the processor 134 may, in operation 613, compare the number of meta-logs stored in the second region with the preset threshold number and determine whether or not the number of meta-logs stored in the second region has reached the preset threshold number.

As a result of operation 613, if it is determined that the second region meets the update condition, the controller 130 may update meta-data that are stored in the first region using at least one of the meta-logs that are stored in the second region in operation 615. For example, if the number of meta-logs in the second region has reached the preset threshold number, the controller 130 may update the meta-data that are present in the first region using at least one of the meta-logs that are present in the second region. In an embodiment, when the number of meta-logs in the second region reaches the preset threshold number, the controller 130 updates the meta-data that are present in the first region using all of the meta-logs that are present in the second region.

For example, in the case where meta-logs are stored in the second region as shown in FIG. 10B, the controller 130 may use at least one of the meta-logs that are present in the second region to update corresponding meta-data of the first region, and invalidate the meta-log used for the update of the meta-data. For example, the controller 130 may use meta-logs corresponding to 'logical value 3', 'physical value 3', 'logical value 10' and 'physical value 1' in the second region to update corresponding meta-data of the first region, and invalidate these meta-logs. That is, when the controller 130 uses the meta-logs corresponding to 'logical value 3', 'physical value 3', 'logical value 10' and 'physical value 1' in the second region to update corresponding meta-data of the first region, as shown in FIG. 11A, the controller 130 may update the meta-data of the first region in such a way that 'logical value 3' is mapped to 'physical value 3' representing page 0 of block 1, and 'logical value 10' is mapped to 'physical value 1' representing page 1 of block 0.

Hence, in an embodiment, when the meta-data that are present in the first region are updated using the meta-logs that are present in the second region and the meta-logs corresponding to the updated meta-data are invalidated, some of the meta-logs may be used for the update of the meta-data and invalidated while the other meta-logs may not be used for the update of the meta-data or invalidated.

A criterion for selecting a eta-log for the updating of the meta-data and the invalidation of the meta-log is that the write requests corresponding to the meta-logs that are present in the second region do not meet the bypass condition as described with reference to operations 517 and 521. That is, a range of the logical addresses of the meta-data corresponding to the meta-logs that are present in the second region is not within the predetermined threshold range.

As described above because the size of meta-data may be relatively large, a plurality of storage operations may be performed to store all of the meta-data in the memory device 150. In an embodiment the meta-data that are present in the first region are divided into a plurality of groups each having a preset number of meta data (i.e., size) and are managed on a group basis. For example, the meta-data that are present in the first region may be divided based on the predetermined threshold range of logical addresses, i.e., the bypass condition as described with reference to operations 517. For example, the meta-data that are present in the first region may be divided into five groups based on the threshold range of logical addresses. When a method is used which stores one group through a single storage operation, then five storage operations are employed for storing, in the memory device 150, all of the meta-data that are present in the first region.

However, as described above with reference to operation 517 and 521, a logical address range of the meta-data corresponding to the meta-logs that are present in the second region may not fail within the predetermined threshold range. That is, the meta-data corresponding to the meta-logs that are present in the second region may have distributed or widely scattered logical address values. Therefore, if it is assumed that the meta-data in the first region are updated using all of the meta-logs that are present in the second region, the plurality of meta-data groups in the first region may be updated simultaneously. The simultaneous update to the plurality of meta-data groups in the first region may cause a plurality of storage operation to be performed in order to store the plurality of meta-data groups, which include updated meta-data of the distributed logical address values in the first region, into the memory device 150. However, this may be a less efficient operating method.

Therefore, in a preferred embodiment of the present invention, when updating the meta-data that are present in the first region based on the meta-logs that are present in the second region, meta-logs for the update of the meta-data and the invalidation may be selected by units of the respective meta-data groups stored in the first region. That is, meta-logs for the update of the meta-data and the invalidation may be selected in such a manner that corresponding meta-data to be updated are included in a single one among the plurality of meta-data groups in the first region. Therefore, the update of the meta-data may be performed by the units of the respective meta-data groups in the first region. When storing the meta-data of the first region into the memory device 150 after the update, it may not be all of the meta-data (i.e., all of the plurality of meta-data groups) but a single meta-data group including the updated meta-data that is required to be stored in the memory device 150. Since meta-logs for the update of the meta-data and the invalidation is selected such that corresponding meta-data to be updated are included in a single one among the plurality of meta-data groups in the first region, only a single storage operation may be performed to reflect the update of the meta-data based on the meta-logs into the memory device 150.

Hence, when the meta-data of the first region are updated based on the meta-logs of the second region and the meta-logs corresponding to the updated meta-data are invalidated, the meta-logs used for the update of the meta-data may be invalidated while the other meta-logs may not be invalidated. Stated otherwise, meta-logs that have been used to update the meta-data that are present in the first region, among the meta logs that are present in the second region, are converted into an invalid state, and meta-logs that have not been used are maintained in a valid state.

In operation 617, the controller 130 may transmit the valid meta-logs of the second region to the memory device 150. In operation 619, the memory device 150 may store the valid meta-logs received from the controller 130. For example, the memory device 150 may store the valid meta-logs in a region predetermined to store valid meta logs, for example, in a second space (not shown) of the memory device 150.

In operation 621, the controller 130 may transmit the invalidated meta-logs of the second region to the memory device 150. In operation 623, the memory device 150 may store the invalid meta-logs received from the controller 130. For example, the memory device 150 may store the invalid meta-logs in a region predetermined to store invalid meta-logs, for example in a third space (not shown) of the memory device 150.

In operation 625, the controller 130 may remove the invalidated meta-logs from the second region of the memory 144. In the case where all of the meta-logs in the second region are invalidated, the second region may be emptied as the controller 130 removes the invalid meta-logs from the second region. In the case where only some of the meta-logs in the second region are invalidated, the other valid meta-logs may remain in a valid state in the second region as the controller 130 removes the invalid meta-logs from the second region.

For example, when meta-logs are included in the second region as illustrated in FIG. 10B, a meta-log of a 'logical value 3' and 'physical value 3' and a meta-log of a 'logical value 10' and 'physical value 1' illustrated in FIG. 11B may be used to update the meta-data of the first region, the controller 130 may update the meta-data of the first region in such a way that logical value 3' is mapped to 'physical value 3' representing page 0 of block 1, and 'logical value 10' is mapped to 'physical value 1' representing page 1 of block 0 as exemplified in FIG. 11A. Therefore, the meta-log of a 'logical value 3' and 'physical value 3' and the meta-log of a 'logical value 10' and 'physical value 1' may be invalidated in the second region. Accordingly, the two invalidated meta-logs may be stored in the memory device 150 and then removed from the second region, as shown in FIG. 11C. Also as shown in FIG. 11C, the one valid meta-log of 'logical value 20' and 'physical value 2' may remain in the second region as it is, rather than being removed, even after having been stored in the memory device 150. Subsequently, the controller 130 may proceed to operation 523 of FIG. 5.

When in operation 613, it is determined that the second region does not meet the update condition, the controller 130 may proceed to operation 523 of FIG. 5. For example, when the number of meta-logs that are present in the second region does not reach the threshold number, the controller 130 may maintain the meta logs that are present in the second region as is. In addition, the controller 130 may also maintain the meta data that are present in the first region as is.

Referring back to FIG. 5, when the memory system 110 is turned off, the controller 130 may detect the turn-off event of the memory system 110 in operation 523. For example, based on a command of the host 102, the controller 130 may detect the event for turning off the memory system 110. In operation 525 the controller 130 may store, in the memory device 150, meta-data that are present in the first region and meta-logs that are present in the second region. The controller 130 may update meta-data of the first region using all of the meta-logs that are present in the second region, invalidate all of the meta-logs that are present in the second region, store the invalidated meta-logs in the memory device 150, erase the second region, and then store the meta-data of the first region that have been updated in the memory device 150.

FIG. 7 is a diagram illustrating the operation 525 of FIG. 5.

Referring to FIG. 7, in operation 711 the controller 130 may determine whether meta-logs are present in the second region of the memory 144.

If, in operation 711, it is determined that no meta-log is present in the second region, the controller 130 may proceed to operation 527. If, in operation 711, it is determined that meta-logs are present in the second region, the controller 130 may update meta-data that are present in the first region using all of the meta-logs that are present in the second region, in operation 713.

The update scheme of the meta-data using the meta-logs may be the same as described with reference to operation 615. For example, a shown in FIG. 10B or FIG. 11C, if meta-logs are present in the second region the controller 130 may update meta-data that are present in the first region using all of the meta-logs that are present in the second region. That is, if meta-logs are present in the second region in the form shown in FIG. 10B, the controller 130 may provide a meta-log mapped with 'logical value 3' and 'physical value 3', a meta-log mapped with 'logical value 10' and 'physical value 1', and a meta-log mapped with 'logical value 20' and 'physical value 2' to the first region. Thereby, as shown in FIG. 12, the controller 130 may map, of the meta data of the first region, 'logical value 3' in correspondence with 'physical value 3', for example, block 1 and page 0, 'logical value 10' in correspondence with 'physical value 1', for example, block 0 and page 1, and 'logical value 20' in correspondence with 'physical value 2', for example, block 2 and page 4. Alternatively, if a meta-log is present in the second region in the form of FIG. 11C, the controller 130 may provide a meta-log mapped with 'logical value 20' and 'physical value 2' to the first region. Thereby, as shown in FIG. 12, the controller 130 may map, of the meta-data of the first region, 'logical value 20' in correspondence with 'physical value 2', for example, block 2 and page 4.

Subsequently, in operation 715, the controller 130 may transmit the meta-data of the first region to the memory device 150. In operation 717, the memory device 150 may store the meta-data. Here, in the case where the updating of the meta data that are present in the first region has been performed for a plurality of meta-data groups of the first region, a plurality of storage operations may be performed by repeating operation 715 and operation 717 for the respective updated meta-data groups. Subsequently, the controller 130 may proceed to operation 527 of FIG. 5.

Referring back to FIG. 5, in operation 527, the controller 130 may turn off the memory system 110. Thereby, the operation of the memory system 110 may be terminated.

In accordance with various embodiments, the memory system 110 may update meta-data in response to a write request of user data. In this regard, the memory system 110 may update the meta-data even without generating a meta-log. As a result, resources required to manage the meta-log and the meta-data in the memory system 110 may be reduced.

Hereinbelow, detailed descriptions will be made with reference to FIGS. 13 to 18 for a data processing system and electronic appliances including the memory system 110.

Figure 13:
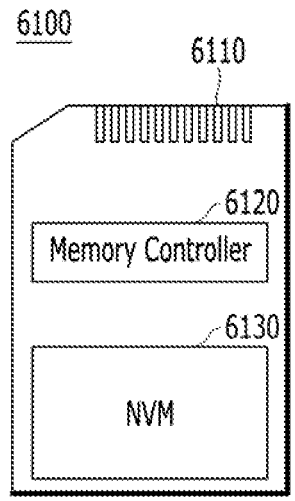
FIGS. 13 to 18 are diagrams illustrating a data processing system and electronic appliances including the memory system of FIGS. 1 to 12.

FIG. 13 is a diagram illustrating a data processing system including the memory system according to an embodiment of the present invention. FIG. 13 is a drawing schematically illustrating a memory card system to which the memory system according to an embodiment is applied.

Referring to FIG. 13, a memory card system 6100 includes a memory controller 6120, a memory device 6130, and a connector 6110.

In detail the memory controller 6120 may be connected with the memory device 6130 and may access the memory device 6130. In some embodiments, the memory device 6130 may be implemented with a nonvolatile memory (NVM). For example, the memory controller 6120 may control read, write, erase and background operations for the memory device 6130. The memory controller 6120 may provide an interface between the memory device 6130 and a host (not shown), and may drive a firmware for controlling the memory device 6130. For example, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit as shown in FIG. 1.

The memory controller 6120 may communicate with an external device (for example, the host 102 described above with reference to FIG. 1), through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PIe), Advanced Technology Attachment (ATA), Serial-ATA, Parallel-ATA, small computer system interface (SCSI), enhanced small disk interface (ESDI), Integrated Drive Electronics (IDE), Firewire, universal flash storage (UFS), wireless-fidelity (WI-FI) and Bluetooth. Accordingly, the memory system and the data processing system according to the embodiment may be applied to wired/wireless electronic appliances, for example, a mobile electronic appliance.

The memory device 6130 may be implemented with a nonvolatile memory. For example, the memory device 6130 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM).

The memory controller 6120 and the memory device 6130 may be integrated into a single semiconductor device. For example, the memory controller 6120 and the memory device 6130 may construct a solid state driver (SSD) by being integrated into a single semiconductor device. The memory controller 6120 and the memory device 6130 may construct a memory card such as a PC card (PCMCIA: Personal Computer Memory Card International Association), a compact flash card (CF), a smart media card (SM and SMC), a memory stick, a multimedia card (MMC, RS-MMC, MMCmicro and eMMC), an SD card (e.g. SD, miniSD, microSD and SDHC) and a universal flash storage (UFS).

Figure 14:
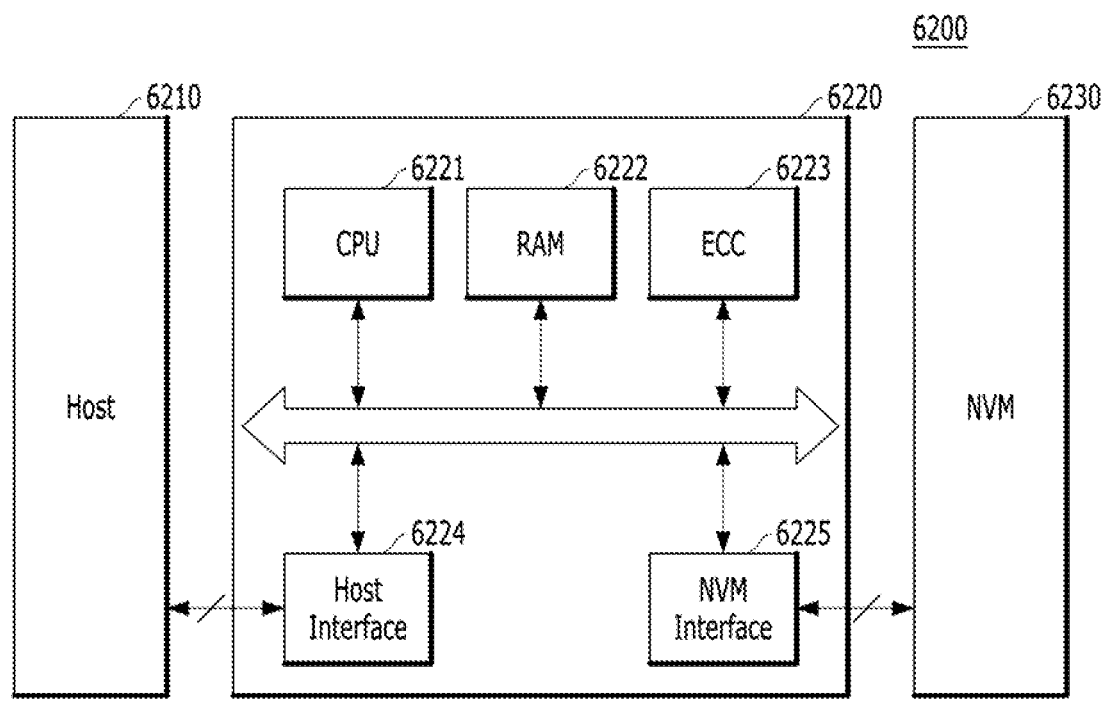

FIG. 14 is a diagram schematically illustrating an example of a data processing system including a memory system according to an embodiment of the present invention.

Referring to FIG. 14, a data processing system 6200 includes a memory device 6230 which may be implemented with at least one nonvolatile memory (NVM) and a memory controller 6220 for controlling the memory device 6230. The data processing system 6200 may be a storage medium such as a memory card (e.g., CF, SD and microSD), as described above with reference to FIG. 1. The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 may control the operations, including the read, write and erase operations for the memory device 6230 in response to requests received from a host 6210. The memory controller 6220 may include a central processing unit (CPU) 6221, a random access memory (RAM) as a buffer memory 6222, an error correction code (ECC) circuit 6223, a host interface 6224, and an NVM interface as a memory interface 6225, all coupled via an internal bus.

The CPU 6221 may control the operations for the memory device 6230 such as read, write, file system management, bad page management, and so forth. The RAM 6222 may operate according to control of the CPU 6221 and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 corresponds to the ECC unit 138 of the controller 130 described above with reference to FIG. 1. As described above with reference to FIG. 1, the ECC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using various coded modulations such as of a low-density parity check (LDPC) code, a Bose-Chaudhuri-Hocquenghem (BCH) code, a turbo code, a Reed-Solomon (RS) code, a convolution code, a recursive systematic code (RSC), a Trellis-coded modulation (TCM) and a Block coded modulation (BCM).

The memory controller 6220 transmits and receives data to and from the host 6210 through the host interface 6224, and transmits and receives data to and from the memory device 6230 through the NVM interface 6225. The host interface 6224 may be connected with the host 6210 through at least one of various interface protocol s such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. Further, as a wireless communication function or a mobile communication protocol such as wireless fidelity (WI-FI) or long term evolution (LTE) is realized, the memory controller 6220 may transmit and receive data by being connected with an external device such as the host 6210 or another external device other than the host 6210. Specifically, as the memory controller 6220 is configured to communicate with an external device through at least one among various communication protocols, the memory system and the data processing system according to the embodiment may be applied to wired/wireless electronic appliances, For example, a mobile electronic appliance.

Figure 15:
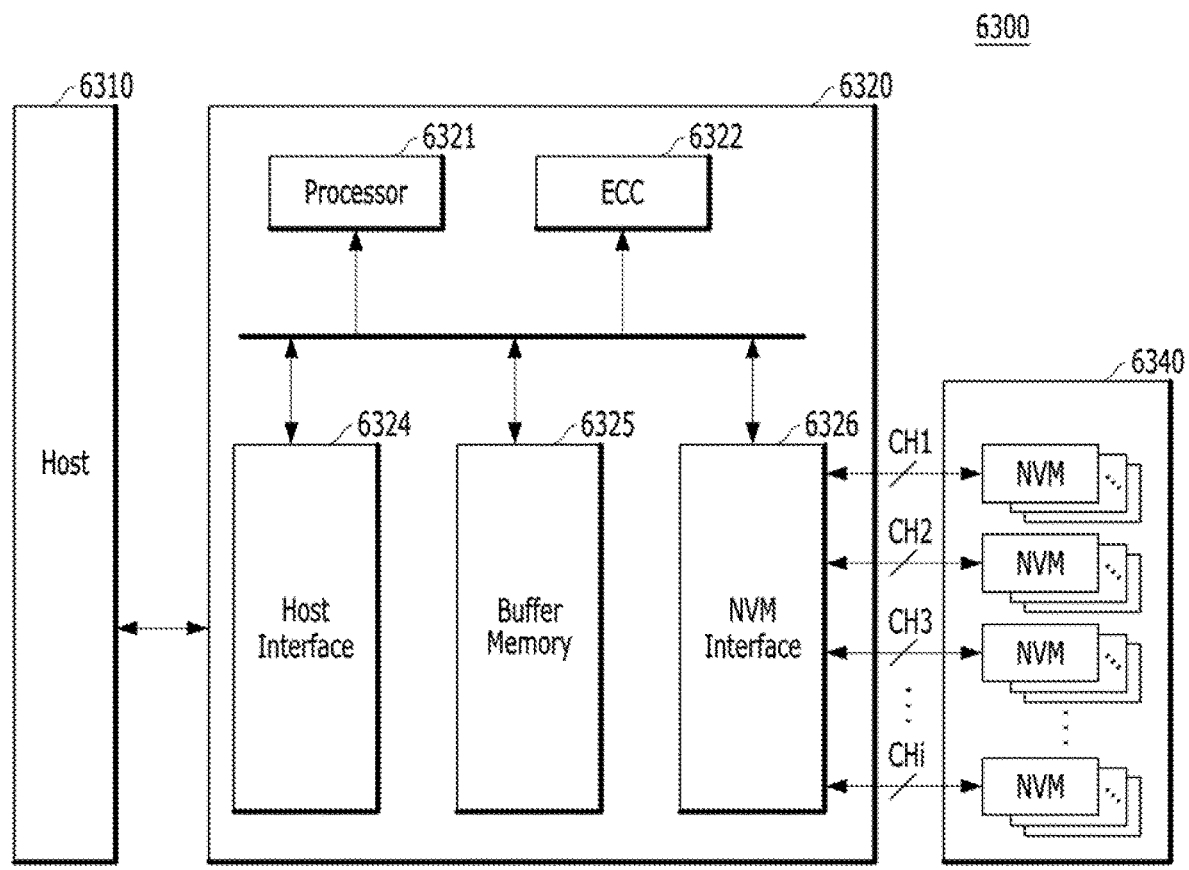

FIG. 15 is a diagram illustrating an example of a data processing system including a memory system according to an embodiment of the invention. FIG. 15 may be a solid state drive (SSD).

Referring to FIG. 15, an SSD 6300 may include a memory device 6340 which may include a plurality of nonvolatile memories NVM and a controller 6320. The controller 6320 may correspond to the controller 130 in the memory system 110 described above with reference to FIG. 1, and the memory device 6340 may correspond to the memory device 150 in the memory system 110 described above with reference to FIG. 1.

The controller 6320 may be connected with the memory device 6340 through a plurality of channels CH1 to CHi. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 temporarily stores data received from a host 6310 or data received from a plurality of nonvolatile memories NVMs included in the memory device 6340, or temporarily stores metadata of the plurality of nonvolatile memories NVMs. For example, the metadata may include map data including mapping tables. The buffer memory 6325 may be implemented with a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 15, for the sake of convenience in explanation, that the buffer memory 6325 is disposed inside the controller 6320, it is to be noted that the buffer memory 6325 may be disposed outside the controller 6320.

The ECC circuit 6322 calculates error correction code values of data to be programmed in the memory device 6340 in a program operation, performs an error correction operation for data read from the memory device 6340, based on the error correction code values, in a read operation, and performs an error correction operation for data recovered from the memory device 6340 in a recovery operation for failed data.

The host interface 6324 provides an interface function with respect to an external device such as the host 6310. The nonvolatile memory interface 6326 provides an interface function with respect to the memory device 6340 which is connected through the plurality of channels CH1 to CHi.

As a plurality of SSDs 6300 to each of which the memory system 110 described above with reference to FIG. 1 is applied are used, a data processing system such as a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system (For example, at least one SSD 6300) in response to the RAID level information of the write command received from the host 6310, among a plurality of RAID levels (for example, the plurality of SSDs 6300) and may output data corresponding to the write command, to the selected SSD 6300, In the case of performing a read operation by receiving a read command from the host 6310, the RAID controller may select at least one memory system (For example, at least one SSD 6300) in response to the RAID level information of the write command received from the host 6310, among the plurality of RAID levels (for example, the plurality of SSDs 6300), and may provide data outputted from the selected SW 6300, to the host 6310.

Figure 16:
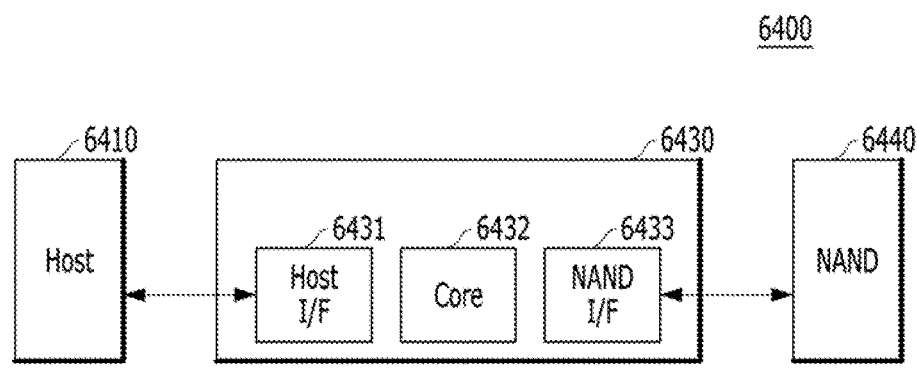

FIG. 16 is a diagram illustrating another example of a data processing system including the memory system according to an embodiment of the present invention. FIG. 16 is a drawing schematically illustrating an embedded multimedia card (eMMC) to which a memory system according to an embodiment is applied.

Referring to FIG. 16, an eMMC 6400 includes a memory device 6440 which is implemented with at least one NAND flash memory, and a controller 6430. The controller 6430 may correspond to the controller 130 in the memory system 110 described above with reference to FIG. 1, and the memory device 6440 may correspond to the memory device 150 in the memory system 110 described above with reference to FIG. 1.

In detail, the controller 6430 may be connected with the memory device 6440 through a plurality of channels. The controller 6430 may include a core 6432, a host interface 6431, and a memory interface such as a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface such as an MMC interface, as described above with reference to FIG. 1, or a serial interface such as an ultra-high speed class 1 (UHS-I)/UHS class 2 (UHS-II) and a universal flash storage (UFS) interface.

Figure 17:
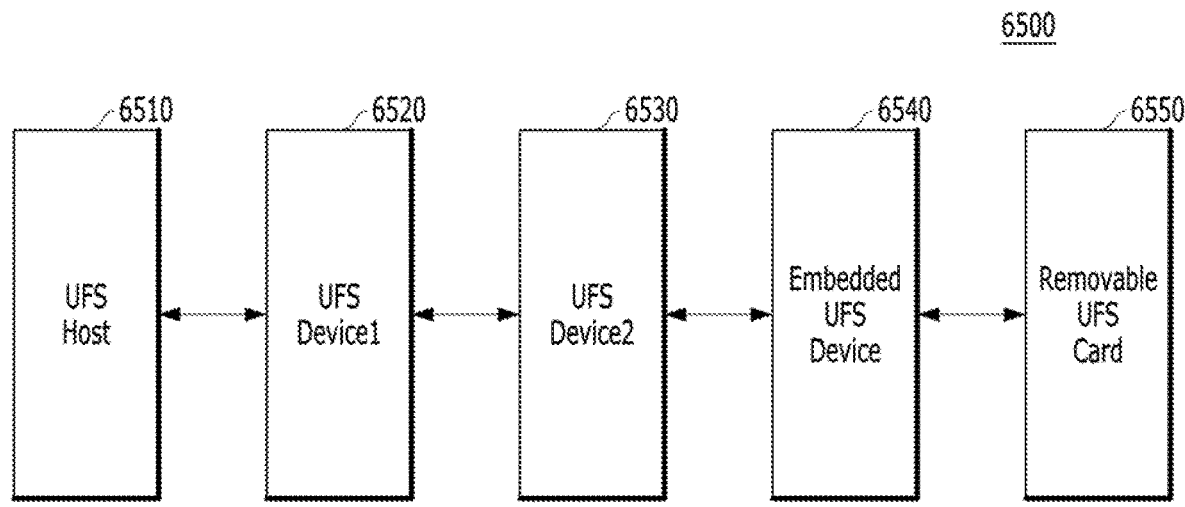

FIG. 17 is a diagram illustrating another example of a data processing system including a memory system according to an embodiment of the present invention. FIG. 16 is a drawing schematically illustrating a universal flash storage (UFS) to which the memory system, according to the embodiment is applied.

Referring to FIG. 17, a UFS system 6500 may include a UFS host 6510, a plurality of UFS devices 6520 and 6530, an embedded UFS device 6540 and a removable UFS card 6550. The UFS host 6510 may be an application processor of wired/wireless electronic appliances, for example, a mobile electronic appliance.

The UFS host 6510, the UFS devices 6520 and 6530, the embedded UFS device 6540 and the removable UFS card 6550 may respectively communicate with external devices such as wired/wireless electronic appliances (for example, a mobile electronic appliance), through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 13. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

Figure 18:
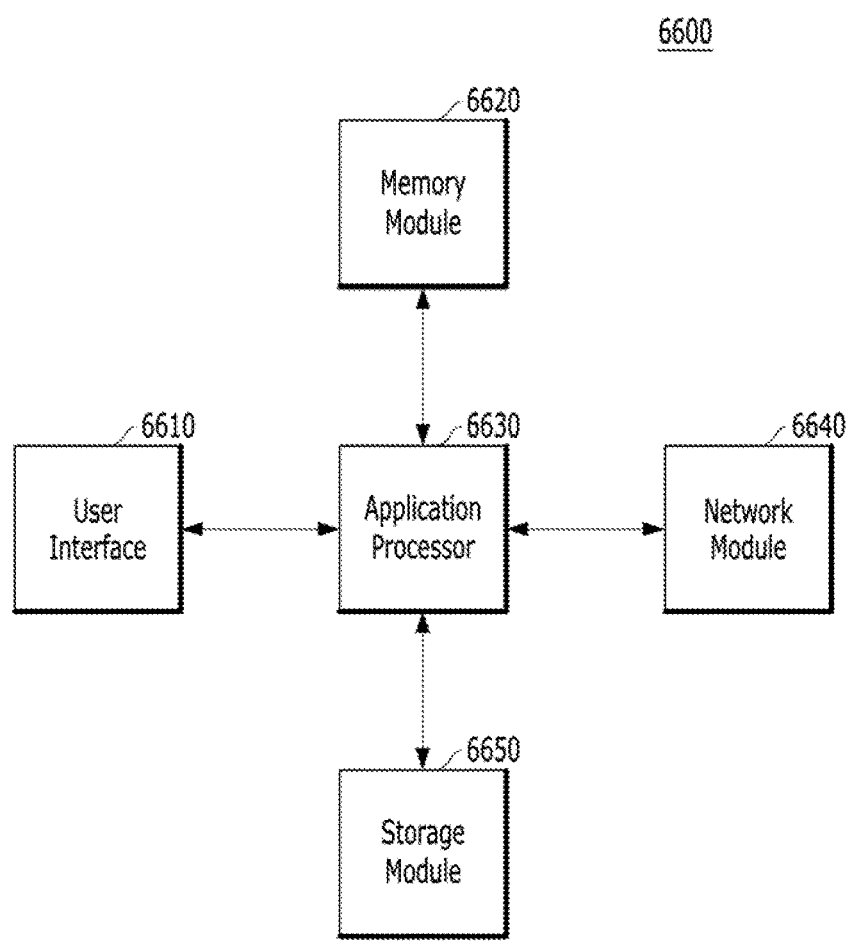

FIG. 18 is a diagram illustrating an example of a data processing system including the memory system according to an embodiment of the present invention. FIG. 18 is a drawing schematically illustrating a user system to which the memory system according to the embodiment is applied.

Referring to FIG. 18, a user system 6600 may include an application processor 6630, a memory module 6620, a network module 6640, a storage module 6650, and a user interface 6610.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), and so on, and may thereby communicate with wired/wireless electronic appliances, For example, a mobile electronic appliance. According to this fact, the memory system and the data processing system according to the embodiment may be applied to wired/wireless electronic appliances. The network module 6640 may be included in the application processor 6630.

The storage module 6650 may store data such as data received from the application processor 6530, and transmit data stored therein, to the application processor 6530. The storage module 6650 may be realized by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 15 to 17.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired/wireless communication with an external device, as described above. The user interface 6610 as the display/touch module of the mobile electronic appliance displays data processed by the application processor 6630 or supports input of data from a touch panel.

In accordance with various embodiments, the memory system may update the meta-data without generating a meta-log, Hence, resources required to manage meta-logs and the meta-data in the memory system may be reduced.

Although various embodiments have been described for illustrative purposes, it will be apparent to those skilled in the art that various changes and modifications may be made without departing from the spirit and scope of the disclosure as defined in the following claims.

What is claimed is:

1. A memory system comprising:
   a nonvolatile memory device suitable for storing write-requested data; and
   a controller including a first volatile memory region suitable for storing a meta-data associated with the write-requested data and a second volatile memory region suitable for storing a meta-log regarding the meta-data,
   wherein the controller generates and stores the meta-data associated with write-requested data in the first volatile memory region without generating the meta-log regarding the generated meta-data, when a logical address of the meta-data being within a predetermined threshold range.

2. The memory system of claim 1, wherein the controller compares the logical address of the meta-data with the predetermined threshold range, when generating the meta-data associated with the write-requested data.

3. The memory system of claim 1, wherein, the controller generates the meta-log regarding the meta-data and stores the meta-log in the second volatile memory region, when the logical address of the meta-data does not fall within the predetermined threshold range.

4. The memory system of claim 3,
   wherein the meta-data stored in the first volatile memory region are divided into a plurality of meta-data groups each having logical address within the predetermined threshold range and a suitable size for being stored to the nonvolatile memory device through a single storage operation, and
   wherein, when a number of meta-logs in the second volatile memory region reaches a predetermined threshold number, the controller further:
   selects one or more meta-logs stored in the second volatile memory region such that corresponding meta-data are included in a single one among the plurality of meta-data groups;
   updates the meta-data based on the meta-logs stored in the second volatile memory region;
   invalidates the meta-logs used for the update of the meta-data;
   stores the updated meta-data, the invalidated meta-logs and remaining valid meta-logs in the nonvolatile memory device; and
   erases the invalidated meta-logs in the second volatile memory region.

5. The memory system of claim 4,
   wherein the respective meta-data includes a logical address mapped to a physical address of the write-requested data stored in the nonvolatile memory device, and
   wherein the respective meta-logs include a logical address mapped to a physical address of the write-requested data stored in the nonvolatile memory device.

6. The memory system of claim 4, wherein, when turning off the memory system, the controller further:
   updates the meta-data based on all of the meta-logs stored in the second volatile memory region;
   invalidates all of the meta-logs stored in the second volatile memory region;
   stores all of the meta-data and all of the meta-logs in the nonvolatile memory device; and
   erases the invalidated meta-logs in the second volatile memory region.

7. The memory system of claim 6, wherein the respective meta-logs represent change history of the respective meta-data stored in the first volatile memory region.

8. The memory system of claim 7, wherein the controller stores the meta-data in the nonvolatile memory device by units of the plurality of meta-data groups through a plurality of storage operations.

9. An operating method for a memory system comprising a nonvolatile memory device, and first and second volatile memory regions, the operating method comprising:
   storing write-requested data in the nonvolatile memory device;
   generating a meta-data associated with the write-requested data;
   selectively generating a meta-log regarding the generated meta-data, wherein the meta-log is not generated when a logical address of the meta-data being within a predetermined threshold range; and
   storing the generated meta-data in the first volatile memory region and the generated meta-log in the second volatile memory region.

10. The operating method of claim 9, further comprising comparing the logical address of the meta-data with the predetermined threshold range, when generating the meta-data associated with the write-requested data.

11. The operating method of claim 9, wherein the selectively generating includes generating the meta-log regarding the meta-data when the logical address of the meta-data does not fall within the predetermined threshold range.

12. The operating method of claim 11,
    wherein the meta-data stored in the first volatile memory region are divided into a plurality of meta-data groups each having logical address within the predetermined threshold range and a suitable size for being stored to the nonvolatile memory device through a single storage operation, and
    when a number of meta-logs in the second volatile memory region reaches a predetermined threshold number, further comprising:
    selecting one or more meta-logs stored in the second volatile memory region such that corresponding meta-data are included in a single one among the plurality of meta-data groups;
    updating the meta-data based on the meta-logs stored in the second volatile memory region;
    invalidating the meta-logs used for the update of the meta-data;
    storing the updated meta-data, the invalidated meta-logs and remaining valid meta-logs in the nonvolatile memory device; and
    erases the invalidated meta-logs in the second volatile memory region.

13. The operating method of claim 12,
    wherein the respective meta-data includes a logical address mapped to a physical address of the write-requested data stored in the nonvolatile memory device, and
    wherein the respective meta-logs include a logical address mapped to a physical address of the write-requested data stored in the nonvolatile memory device.

14. The operating method of claim 12, when turning off the memory system, further comprising:
    updating the meta-data based on all of the meta-logs stored in the second volatile memory region;
    invalidating all of the meta-logs stored in the second volatile memory region;
    storing all of the meta-data and all of the meta-logs in the nonvolatile memory device; and
    erasing the invalidated meta-logs in the second volatile memory region.

15. The operating method of claim 14, wherein the respective meta-logs represent change history of the respective meta-data stored in the first volatile memory region.

16. The operating method of claim 15, wherein the storing of the meta-data in the nonvolatile memory device is performed by units of the plurality of meta-data groups through a plurality of storage operations.

* * * * *